(12) United States Patent
Cai

(10) Patent No.: US 11,527,577 B2
(45) Date of Patent: Dec. 13, 2022

(54) ARRAY SUBSTRATE AND DISPLAY PANEL HAVING HEXAGONAL SUB-PIXELS

(71) Applicant: Shenzhen China Star Optoelectronics Semiconductor Display Technology Co., Ltd., Shenzhen (CN)

(72) Inventor: Zhenfei Cai, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 353 days.

(21) Appl. No.: 16/757,395

(22) PCT Filed: Mar. 13, 2020

(86) PCT No.: PCT/CN2020/079217
§ 371 (c)(1),
(2) Date: Apr. 19, 2020

(87) PCT Pub. No.: WO2021/142908
PCT Pub. Date: Jul. 22, 2021

(65) Prior Publication Data
US 2021/0408157 A1 Dec. 30, 2021

(30) Foreign Application Priority Data
Jan. 17, 2020 (CN) .......................... 202010052656.3

(51) Int. Cl.
*H01L 27/32* (2006.01)
(52) U.S. Cl.
CPC ...... *H01L 27/3218* (2013.01); *H01L 27/3213* (2013.01); *H01L 27/3276* (2013.01)

(58) Field of Classification Search
CPC .................................................. H01L 27/3218
See application file for complete search history.

(56) References Cited

U.S. PATENT DOCUMENTS

| 8,354,789 B2 | 1/2013 | Kim et al. |
| 2005/0237449 A1 | 10/2005 | Wu et al. |
| 2018/0226021 A1 | 8/2018 | Jin |

FOREIGN PATENT DOCUMENTS

| CN | 109215572 | 1/2009 |
| CN | 103943059 | 7/2014 |
| CN | 106206657 | 12/2016 |
| CN | 109300958 | 2/2019 |

OTHER PUBLICATIONS

Satoh et al., EP 1742514 A1, published Jan. 10, 2007.*

* cited by examiner

*Primary Examiner* — Suberr L Chi

(57) ABSTRACT

The present invention provides an array substrate and a display panel. The array substrate includes a pixel structure. The pixel structure includes a plurality of pixel units. Each of the plurality of pixel units includes a first sub-pixel, a second sub-pixel, and a third sub-pixel connected in pairs and arranged in a honeycomb pattern, which facilitates spread of printed ink droplets and increases uniformity of light emission of sub-pixels. Each of the plurality of pixel units adopts an arrangement of RB1B2G or RB1GB2. Two columns of blue sub-pixels are alternately used to balance a problem of short lifetime of blue sub-pixel.

19 Claims, 6 Drawing Sheets

# ARRAY SUBSTRATE AND DISPLAY PANEL HAVING HEXAGONAL SUB-PIXELS

RELATED APPLICATIONS

This application is a National Phase of PCT Patent Application No. PCT/CN2020/079217 having International filing date of Mar. 13, 2020, which claims the benefit of priority of Chinese Patent Application No. 202010052656.3 filed on Jan. 17, 2020. The contents of the above applications are all incorporated by reference as if fully set forth herein in their entirety.

FIELD AND BACKGROUND OF THE INVENTION

The present invention is related to the field of display technology, and specifically to an array substrate and a display panel.

Organic light-emitting diodes (OLEDs), as a type of current-driven light-emitting devices, are being increasingly applied in high-performance display fields due to their characteristics of self-emission, fast response times, wide viewing angles, and ability to be fabricated on flexible substrates.

For OLED products, an inkjet printing process has a huge cost advantage of saving OLED materials. However, a problem of poor spreadability of printed ink droplets often occurs in an actual printing process, which affects uniformity of light emission of pixels in sub-pixels. Structures of printed sub-pixels are usually designed to be ellipse shapes, but the ellipse shapes sacrifice a pixel aperture ratio to a certain extent. Currently, blue sub-pixels produced by the inkjet printing process have low luminous efficiency and low luminous lifetime, and a problem of color shift often occurs due to insufficient luminous brightness.

In summary, it is necessary to provide a new array substrate and a display panel to solve the above technical problems.

SUMMARY OF THE INVENTION

Array substrates and display panels provided by the present invention solve technical problems that uniformity of light emission of sub-pixels and a pixel aperture ratio cannot be guaranteed when current array substrates and display panels produce pixel structures by an inkjet printing process.

In order to solve the above problems, the present invention provides technical solution as follows.

The present invention provides an array substrate including a pixel structure. The pixel structure includes a plurality of scan lines and a plurality of data lines. The plurality of scan lines and the plurality of data lines define a plurality of pixel units by crossing each other. Each of the plurality of pixel units includes a first sub-pixel, a second sub-pixel, and a third sub-pixel connected in pairs and arranged in a honeycomb pattern. Shapes of the first sub-pixel, the second sub-pixel, and the third sub-pixel are all regular hexagonal. Each column of sub-pixels displays a same color.

According to the array substrate provided by an embodiment of the present invention, the first sub-pixel, the second sub-pixel, and the third sub-pixel are respectively a red sub-pixel, a blue sub-pixel, and a green sub-pixel.

Each of the plurality of pixel units further includes a fourth sub-pixel. The fourth sub-pixel is a blue sub-pixel. The first sub-pixel, the second sub-pixel, the third sub-pixel, and the fourth sub-pixel are arranged in a honeycomb pattern.

According to the array substrate provided by an embodiment of the present invention, the fourth sub-pixel is disposed between the second sub-pixel and the third sub-pixel.

According to the array substrate provided by an embodiment of the present invention, the fourth sub-pixel is disposed between the third sub-pixel and the first sub-pixel of a next plurality of pixel units.

According to the array substrate provided by an embodiment of the present invention, the pixel structure includes even-numbered rows and odd-numbered rows. Each of the plurality of pixel units includes the first sub-pixel in an even-numbered row, the fourth sub-pixel in an even-numbered row, the second sub-pixel in an odd-numbered row, and the third sub-pixel in an odd-numbered row.

According to the array substrate provided by an embodiment of the present invention, the plurality of data lines are disposed along a longitudinal edge of each column of sub-pixels. The plurality of data lines are polygonal line shapes. The plurality of scan lines include odd-numbered scan lines and even-numbered scan lines. The plurality of the scan lines are disposed along a lateral edge of each column of sub-pixels.

According to the array substrate provided by an embodiment of the present invention, the array substrate includes a gate driver and a source driver. The gate driver includes a first gate driver and a second gate driver disposed on two opposite sides of the pixel structure. The first gate driver is configured to provide a scanning signal to the odd-numbered scan lines. The second gate driver is configured to provide a scanning signal to the even-numbered scan lines. The source driver is configured to provide a data signal to the plurality of data lines.

According to the array substrate provided by an embodiment of the present invention, the plurality of data lines include odd-numbered data lines and even-numbered data lines. The plurality of the data lines are disposed along a lateral edge of each column of sub-pixels. The plurality of scan lines are disposed along a longitudinal edge of each column of sub-pixels. The plurality of scan lines are polygonal line shapes.

According to the array substrate provided by an embodiment of the present invention, the array substrate includes a gate driver and a source driver. The source driver includes a first source driver and a second source driver disposed on two opposite sides of the pixel structure. The first source driver is configured to provide a data signal to the odd-numbered data lines. The second source driver is configured to provide a data signal to the even-numbered data lines. The gate driver is configured to provide a scanning signal to the plurality of scan lines.

The present invention provides an array substrate including a pixel structure. The pixel structure includes a plurality of scan lines and a plurality of data lines. The plurality of scan lines and the plurality of data lines define a plurality of pixel units by crossing each other. Each of the plurality of pixel units includes a first sub-pixel, a second sub-pixel, and a third sub-pixel connected in pairs and arranged in a honeycomb pattern. Shapes of the first sub-pixel, the second sub-pixel, and the third sub-pixel are all regular hexagonal.

According to the array substrate provided by an embodiment of the present invention, the first sub-pixel, the second sub-pixel, and the third sub-pixel are respectively a red sub-pixel, a blue sub-pixel, and a green sub-pixel. Each of the plurality of pixel units further includes a fourth sub-pixel. The fourth sub-pixel is a blue sub-pixel. The first sub-pixel, the second sub-pixel, the third sub-pixel, and the fourth sub-pixel are arranged in a honeycomb pattern.

According to the array substrate provided by an embodiment of the present invention, the fourth sub-pixel is disposed between the second sub-pixel and the third sub-pixel.

According to the array substrate provided by an embodiment of the present invention, the fourth sub-pixel is disposed between the third sub-pixel and the first sub-pixel of a next plurality of pixel units.

According to the array substrate provided by an embodiment of the present invention, the pixel structure includes even-numbered rows and odd-numbered rows. Each of the plurality of pixel units includes the first sub-pixel in an even-numbered row, the fourth sub-pixel in an even-numbered row, the second sub-pixel in an odd-numbered row, and the third sub-pixel in an odd-numbered row.

According to the array substrate provided by an embodiment of the present invention, the plurality of data lines are disposed along a longitudinal edge of each column of sub-pixels. The plurality of data lines are polygonal line shapes. The plurality of scan lines include odd-numbered scan lines and even-numbered scan lines. The plurality of the scan lines are disposed along a lateral edge of each column of sub-pixels.

According to the array substrate provided by an embodiment of the present invention, the array substrate includes a gate driver and a source driver. The gate driver includes a first gate driver and a second gate driver disposed on two opposite sides of the pixel structure. The first gate driver is configured to provide a scanning signal to the odd-numbered scan lines. The second gate driver is configured to provide a scanning signal to the even-numbered scan lines. The source driver is configured to provide a data signal to the plurality of data lines.

According to the array substrate provided by an embodiment of the present invention, the plurality of data lines include odd-numbered data lines and even-numbered data lines. The plurality of the data lines are disposed along a lateral edge of each column of sub-pixels. The plurality of scan lines are disposed along a longitudinal edge of each column of sub-pixels. The plurality of scan lines are polygonal line shapes.

According to the array substrate provided by an embodiment of the present invention, the array substrate includes a gate driver and a source driver. The source driver includes a first source driver and a second source driver disposed on two opposite sides of the pixel structure. The first source driver is configured to provide a data signal to the odd-numbered data lines. The second source driver is configured to provide a data signal to the even-numbered data lines. The gate driver is configured to provide a scanning signal to the plurality of scan lines.

The present invention provides a display panel including the above array substrate.

Beneficial effects of the present invention: the array substrate and the display panel provided by the present invention configure each of the sub-pixels to a regular hexagonal shape, wherein corners of each of the sub-pixels are obtuse angles of 120°, which facilitate spread of printed ink droplets in the inkjet printing process and significantly increase uniformity of light emission of the sub-pixels. Also, each of the plurality of pixel units adopts an arrangement of RB1B2G or RB1GB2. Two columns of blue sub-pixels are alternately used to balance a problem of short lifetime of blue sub-pixel, which is beneficial for realizing mass production of inkjet printing products and meets a requirement of high pixel density products.

BRIEF DESCRIPTION OF THE SEVERAL VIEWS OF THE DRAWINGS

In order to describe embodiments and technical solutions in the prior art clearly, drawings to be used in the description of the embodiments or the prior art will be described briefly below. Obviously, drawings described below are only for some embodiments of the present invention, and other drawings may be obtained by those skilled in the art based on these drawings without creative efforts.

DESCRIPTION OF SPECIFIC EMBODIMENTS OF THE INVENTION

Figure 1:
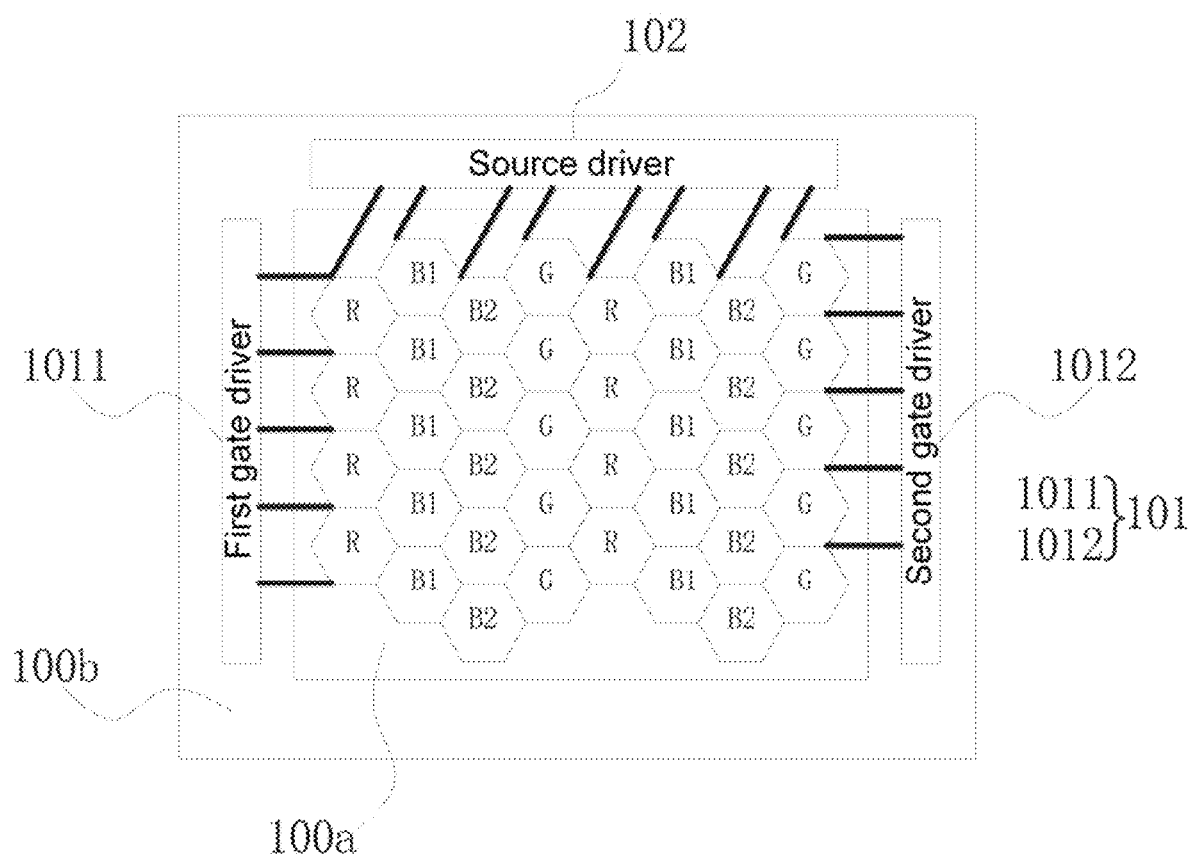
FIG. 1 is a planar structural diagram of an array substrate provided by an embodiment of the present invention.

Examples are described below with reference to the appended drawings, and the drawings illustrate particular embodiments in which the present invention may be practiced. Directional terms mentioned in the present invention, such as upper, lower, front, rear, left, right, in, out, side, etc., only refer to directions in the accompanying drawings. Thus, the adoption of directional terms is used to describe and understand the present invention, but not to limit the present invention. In the drawings, units of similar structures are represented using the same numerals.

The present invention can solve defects of current array substrates and display panels that uniformity of light emission of sub-pixels and a pixel aperture ratio cannot be guaranteed when pixel structures are produced by an inkjet printing process.

As shown in FIG. 1, an array substrate provided by a present invention includes a display region 100a and a non-display region 100b. A pixel structure is disposed in the display region 100a for light-emitting display. A driving circuit is disposed in the non-display region for driving a plurality of pixel units in the pixel structure to emit light.

Figure 2:
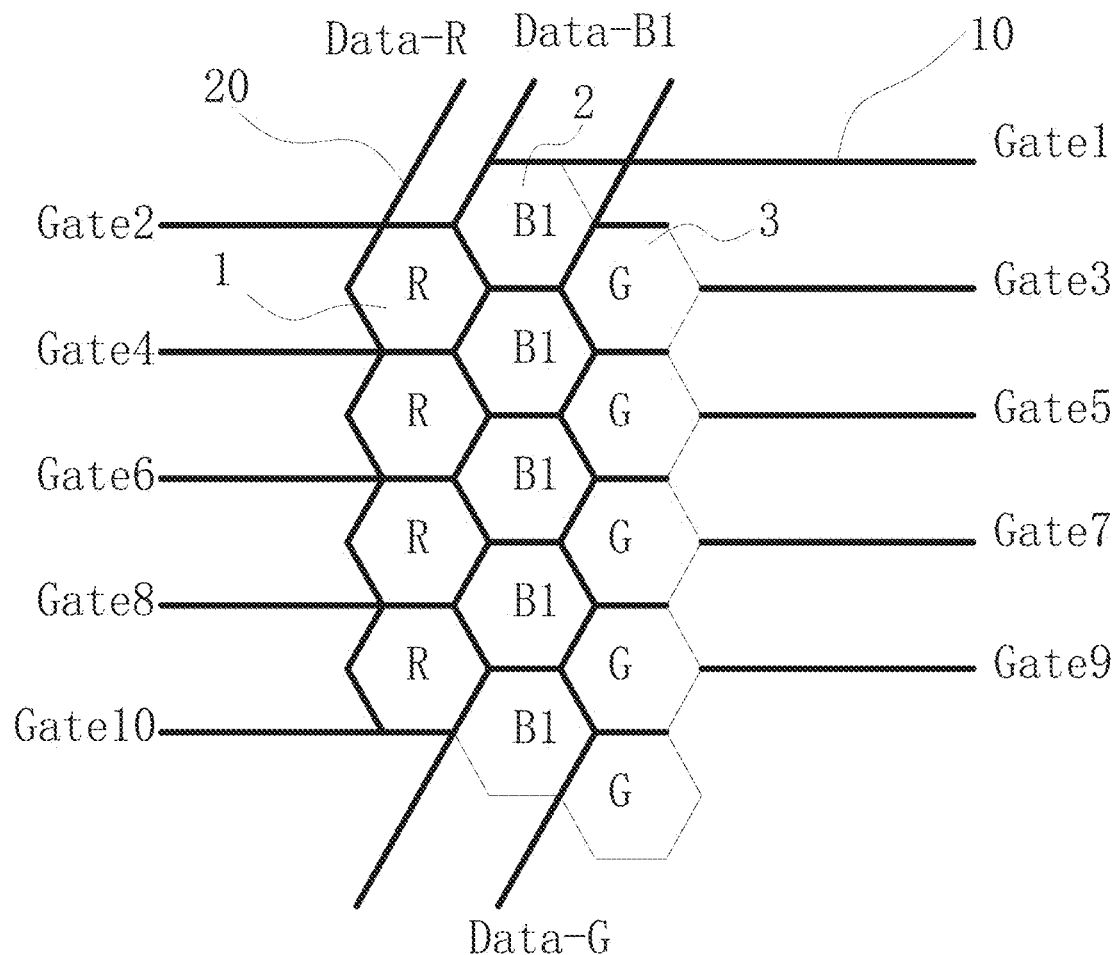
FIG. 2 is a structural diagram of a first pixel structure provided by an embodiment of the present invention.
Figure 3:
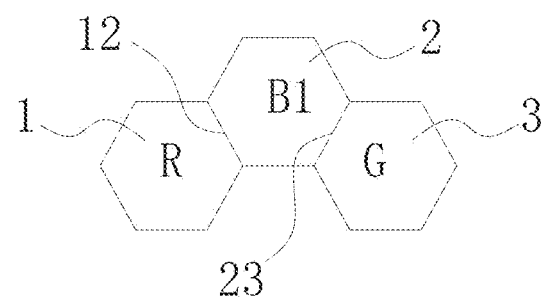
FIG. 3 is a structural diagram of a plurality of pixel units of the first pixel structure in FIG. 2.

As shown in FIG. 2, the pixel structure includes a plurality of scan lines 10 and a plurality of data lines 20. The plurality of scan lines 10 and the plurality of data lines 20 define the plurality of pixel units by crossing each other. Each of the plurality of pixel units includes a first sub-pixel 1, a second sub-pixel 2, and a third sub-pixel 3 connected in pairs and arranged in a honeycomb pattern. Shapes of the first sub-pixel 1, the second sub-pixel 2, and the third sub-pixel 3 are all regular hexagonal. On one hand, interior angles of a regular hexagon are obtuse angles, and distances from a center of the regular hexagon to vertices are equal. Hence ink droplets can be spread evenly in the sub-pixels with better spreadability when the pixel structure provided by this embodiment of the present invention is used for inkjet printing. On the other hand, because each of the interior angles of the regular hexagon is 120°, the sub-pixels can be arranged closely, thereby increasing the pixel aperture ratio. Taking one of the plurality of pixel units as an example, as shown in FIG. 3, the first sub-pixel 1 is connected to the second sub-pixel 2 by a connecting edge 12, and the second sub-pixel 2 is connected to the third sub-pixel 3 by a connecting edge 23.

In an embodiment of the present invention, the first sub-pixel 1, the second sub-pixel 2, and the third sub-pixel 3 are respectively a red sub-pixel R, a blue sub-pixel B1, and a green sub-pixel G. Each column of the sub-pixels displays a same color.

Furthermore, because luminous efficiency and luminous lifetime of the blue sub-pixel B1 printed by the inkjet printing are low, insufficient luminous brightness and color shift are prone to occur. Therefore, based on the RGB pixel structure provided above, each of the plurality of pixel units is added with at least one column of blue sub-pixel B2, and the blue sub-pixel B1 and blue sub-pixel B2 alternately emit light to extend the lifetime of the blue sub-pixels. Specifically, each of the plurality of pixel units further includes a fourth sub-pixel 4. The fourth sub-pixel 4 is a blue sub-pixel. The first sub-pixel 1, the second sub-pixel 2, the third sub-pixel 3, and the fourth sub-pixel 4 are arranged in a honeycomb pattern.

Figure 4:
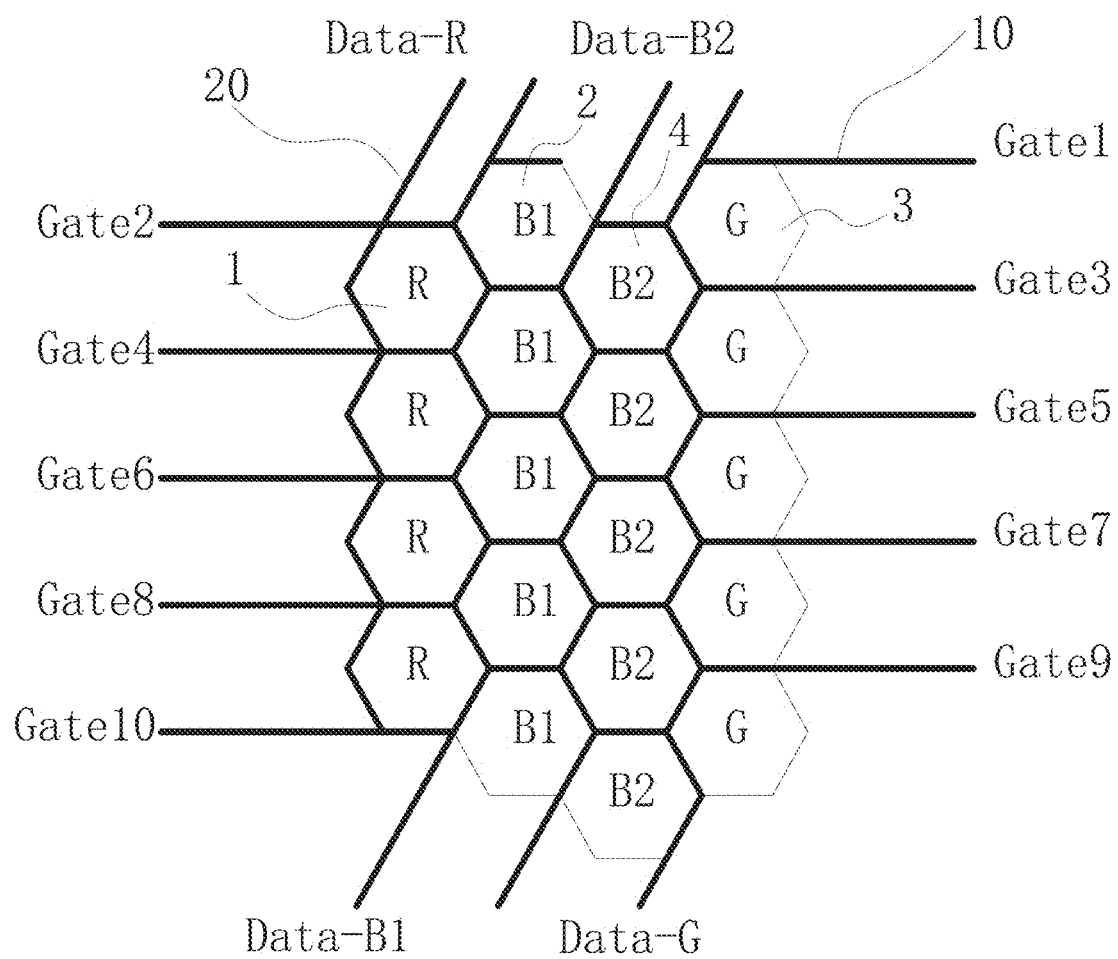
FIG. 4 is a structural diagram of a second pixel structure provided by an embodiment of the present invention.

In an embodiment, as shown in FIG. 4, the fourth sub-pixel 4 can be disposed between the second sub-pixel 2 and the third sub-pixel 3, which means that two columns of blue sub-pixels in a same pixel unit are disposed adjacent to each other, and each of the plurality of pixel units is arranged in an arrangement of RB1B2G. Similarly, taking one of the plurality of pixel units as an example, as shown in FIG. 5, the first sub-pixel 1 is connected to the second sub-pixel 2 by a connecting edge 12, the second sub-pixel 2 is connected to the fourth sub-pixel 4 by a connecting edge 24, and the fourth sub-pixel 4 is connected to the third sub-pixel 3 by a connecting edge 43.

Figure 6:
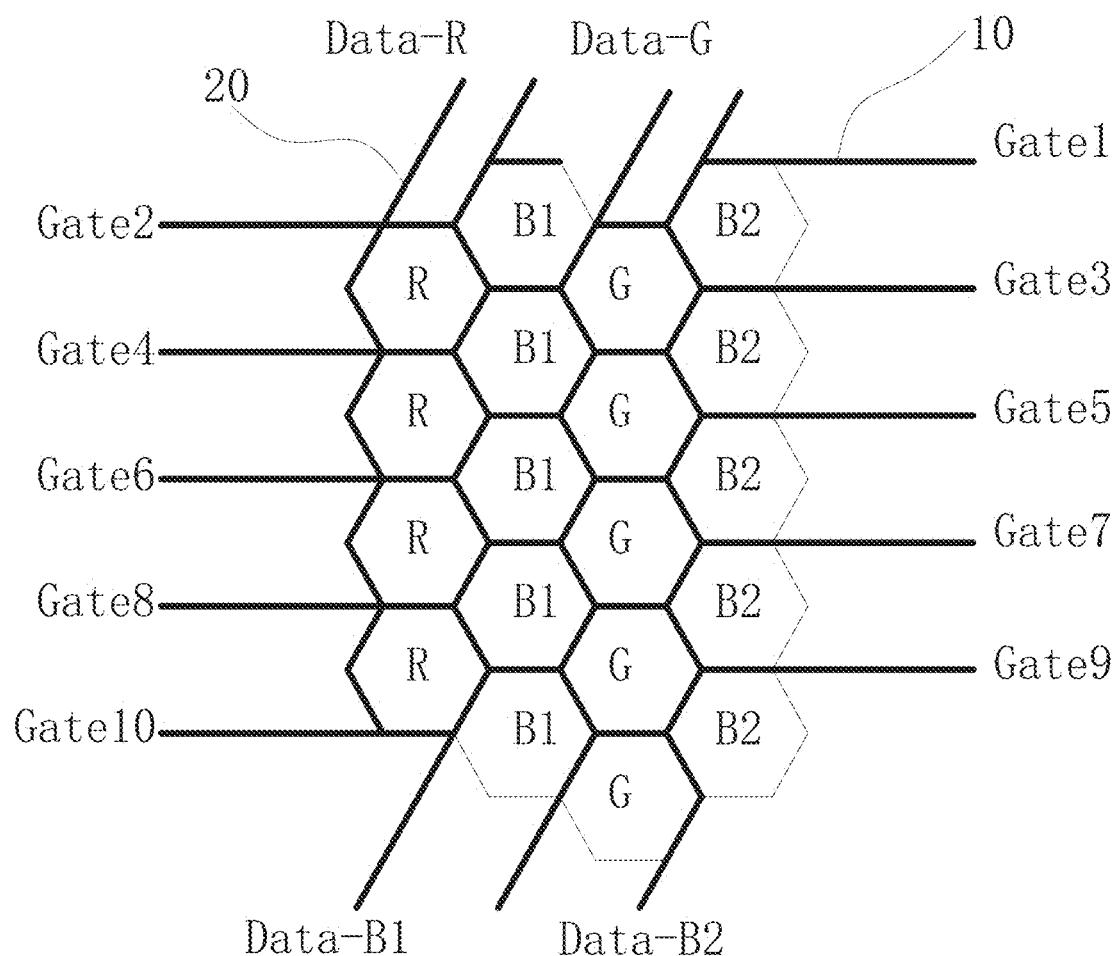
FIG. 6 is a structural diagram of a third pixel structure provided by an embodiment of the present invention.
Figure 7:
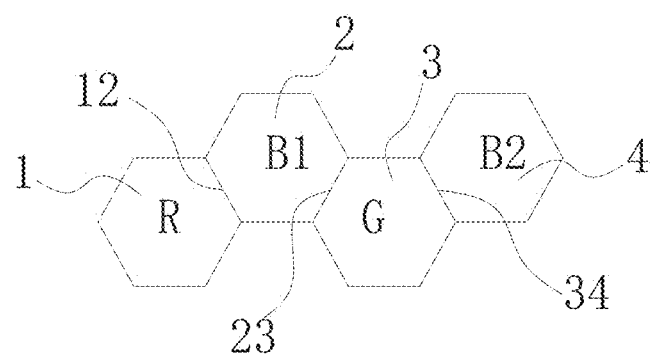
FIG. 7 is a structural diagram of a plurality of pixel units of the third pixel structure in FIG. 6.

In another embodiment, as shown in FIG. 6, the fourth sub-pixel 4 can be disposed between the third sub-pixel 3 and the first sub-pixel 1 of a next plurality of pixel units, which means that two columns of blue sub-pixels in a same pixel unit are disposed spaced from each other, and each of the plurality of pixel units is arranged in an arrangement of RB1GB2. Similarly, taking one of the plurality of pixel units as an example, as shown in FIG. 7, the first sub-pixel 1 is connected to the second sub-pixel 2 by a connecting edge 12, the second sub-pixel 2 is connected to the third sub-pixel 3 by a connecting edge 23, and the third sub-pixel 3 is connected to the fourth sub-pixel 4 by a connecting edge 34.

It should be explained that an embodiment of the present invention is described based on adding one column of blue sub-pixel as an example to the original RGB pixels. However, embodiments of the present invention should not be limited to this. According to actual situations, two columns of blue sub-pixels, three columns of blue sub-pixels, or even more columns of blue sub-pixels can be added.

Figure 5:
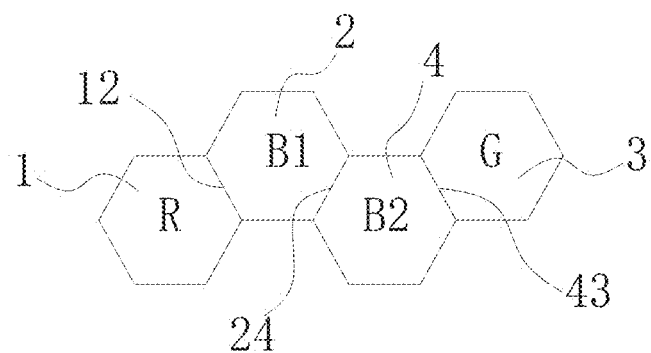
FIG. 5 is a structural diagram of a plurality of pixel units of the second pixel structure in FIG. 4.

Referring to FIGS. 4 and 5 and taking each of the plurality of pixel units adopting an arrangement of RB1GB2 as an example, the pixel structure includes even-numbered rows and odd-numbered rows. Each of the plurality of pixel units includes the first sub-pixel 1 in an even-numbered row, the fourth sub-pixel 4 in an even-numbered row, the second sub-pixel 2 in an odd-numbered row, and the third sub-pixel 3 in an odd-numbered row. Each of the sub-pixels includes a lateral edge and a longitudinal edge. It should be explained that the lateral edge is parallel to a horizontal direction, and the longitudinal edge extends to a vertical direction. The pixel structure further includes a plurality of signal lines such as the plurality of scan lines 10 and the plurality of data lines 20. In an embodiment, the plurality of data lines 20 are disposed along a longitudinal edge of each column of the sub-pixels. The plurality of data lines 20 are polygonal line shapes. The plurality of scan lines 10 include odd-numbered scan lines and even-numbered scan lines. The plurality of the scan lines 10 are disposed along a lateral edge of each column of the sub-pixels. In this embodiment of the present invention, the plurality of the data lines 20 are disposed on a left side of each column of the sub-pixels, and the sub-pixels in a same column share one of the plurality of the data lines 20.

Specifically, a data line Data-R controls light emission of the first sub-pixel 1, a data line Data-B1 controls light emission of the second sub-pixel 2, a data line Data-B2 controls light emission of the fourth sub-pixel 4, and a data line Data-G controls light emission of the third sub-pixel 3. The odd-numbered scan lines control switches of the second sub-pixel 2 and the third sub-pixel 3, and the even-numbered scan lines control switches of the first sub-pixel 1 and the fourth sub-pixel 4. Taking pixel units controlled by a scan line Gate1 and a scan line Gate2 as an example to briefly describe a driving method of the pixel units, gates of thin-film transistors in the second sub-pixel 2 and the third sub-pixel 3 are turned on when the scan line Gate1 is at a high voltage level, and data signals are respectively transmitted to sources of the thin-film transistors in the second sub-pixel 2 and the third sub-pixel 3 through the data line Data-B1 and the data line Data-G, thereby realizing light emission of the second sub-pixel 2 and the third sub-pixel 3. Gates of thin-film transistors in the first sub-pixel 1 and the fourth sub-pixel 4 are turned on when the scan line Gate2 is at a high voltage level, and data signals are respectively transmitted to sources of the thin-film transistors in the first sub-pixel 1 and the fourth sub-pixel 4 through the data line Data-R and the data line Data-B2, thereby realizing light emission of the first sub-pixel 1 and the fourth sub-pixel 4. Accordingly, the pixel unit emits light. Alternatively, the data line Data-B1 and the data line Data-B2 are selectively turned on, so the second sub-pixel 2 and the fourth sub-pixel 4 realize alternate light emission, which means that the blue sub-pixel B1 and the blue sub-pixel B2 emit light alternately. Thus, it can extend lifetime of the blue sub-pixels.

Furthermore, referring to FIG. 1, the array substrate includes a gate driver 101 and a source driver 102. The gate driver 101 includes a first gate driver 1011 and a second gate driver 1012 disposed on two opposite sides of the pixel structure. The first gate driver 1011 is configured to provide a scanning signal to the odd-numbered scan lines. The second gate driver 1012 is configured to provide a scanning signal to the even-numbered scan lines. The source driver 102 is configured to provide a data signal to the plurality of data lines 20. Thus, a method adopting double gate driver can increase luminous efficiency of pixels.

Figure 8:
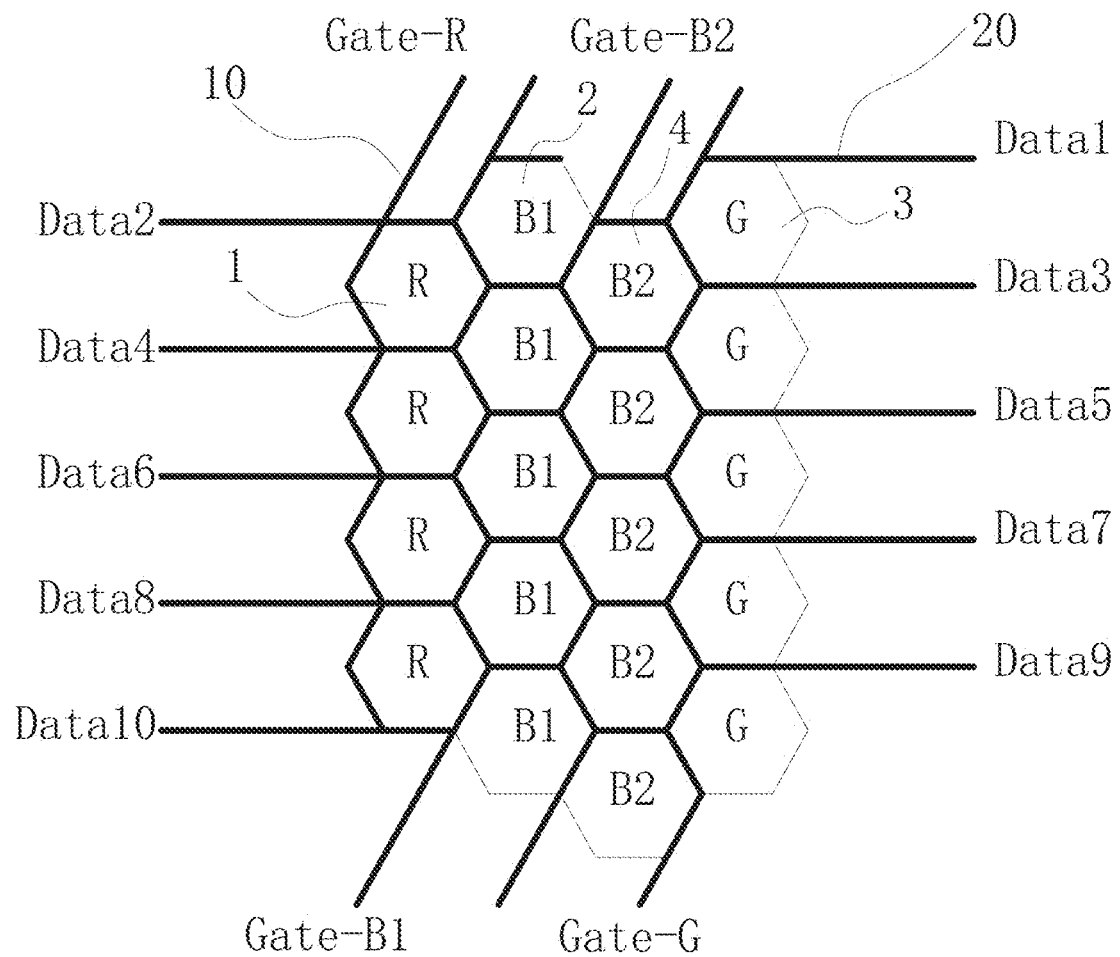
FIG. 8 is a structural diagram of a fourth pixel structure provided by an embodiment of the present invention.

Of course, in another embodiment, as shown in FIG. 8, positions of the plurality of data lines 20 and the plurality of scan lines 10 are interchangeable. In other words, the plurality of data lines 20 include odd-numbered data lines and even-numbered data lines. The plurality of the data lines 20 are disposed along the lateral edge of each column of the sub-pixels. The plurality of scan lines 10 are disposed along the longitudinal edge of each column of the sub-pixels. The plurality of scan lines 10 are polygonal line shapes. The plurality of the scan lines 10 are disposed on the left side of each column of the sub-pixels, and the sub-pixels in a same column share one of the plurality of the scan lines 10.

Similarly, specifically, a scan line Gate-R controls light emission of the first sub-pixel 1, a scan line Gate-B1 controls light emission of the second sub-pixel 2, a scan line Gate-B2 controls light emission of the fourth sub-pixel 4, and a scan line Gate-G controls light emission of the third sub-pixel 3. The odd-numbered data lines control switches of the second sub-pixel 2 and the third sub-pixel 3, and the even-numbered data lines control switches of the first sub-pixel 1 and the fourth sub-pixel 4. Taking pixel units controlled by a data line Data1 and a data line Data2 as an example to briefly describe a driving method of the pixel units, gates of thin-film transistors in the first sub-pixel 1, the second sub-pixel 2, the third sub-pixel 3, and the fourth sub-pixel 4 of each column are turned on when the scan line Gate-R the scan line Gate-B1, the scan line Gate-B2, and the scan line Gate-G are at a high voltage level. Data signals are respectively transmitted to sources of the thin-film transistors in the second sub-pixel 2 and the third sub-pixel 3 through the data line Data1 when the data line Data1 is at a high voltage level, thereby realizing light emission of the second sub-pixel 2 and the third sub-pixel 3. Data signals are respectively transmitted to sources of the thin-film transistors in the first sub-pixel 1 and the fourth sub-pixel 4 through the data line Data2 when the data line Data2 is at a high voltage level, thereby realizing light emission of the first sub-pixel 1 and the fourth sub-pixel 4. Accordingly, the pixel unit emits light. Alternatively, the scan line Gate-B1 and the scan line Gate-B2 are selectively turned on, so the second sub-pixel 2 and the fourth sub-pixel 4 realize alternate light emission, which means that the blue sub-pixel B1 and the blue sub-pixel B2 emit light alternately. Thus, it can extend lifetime of the blue sub-pixels.

Figure 9:
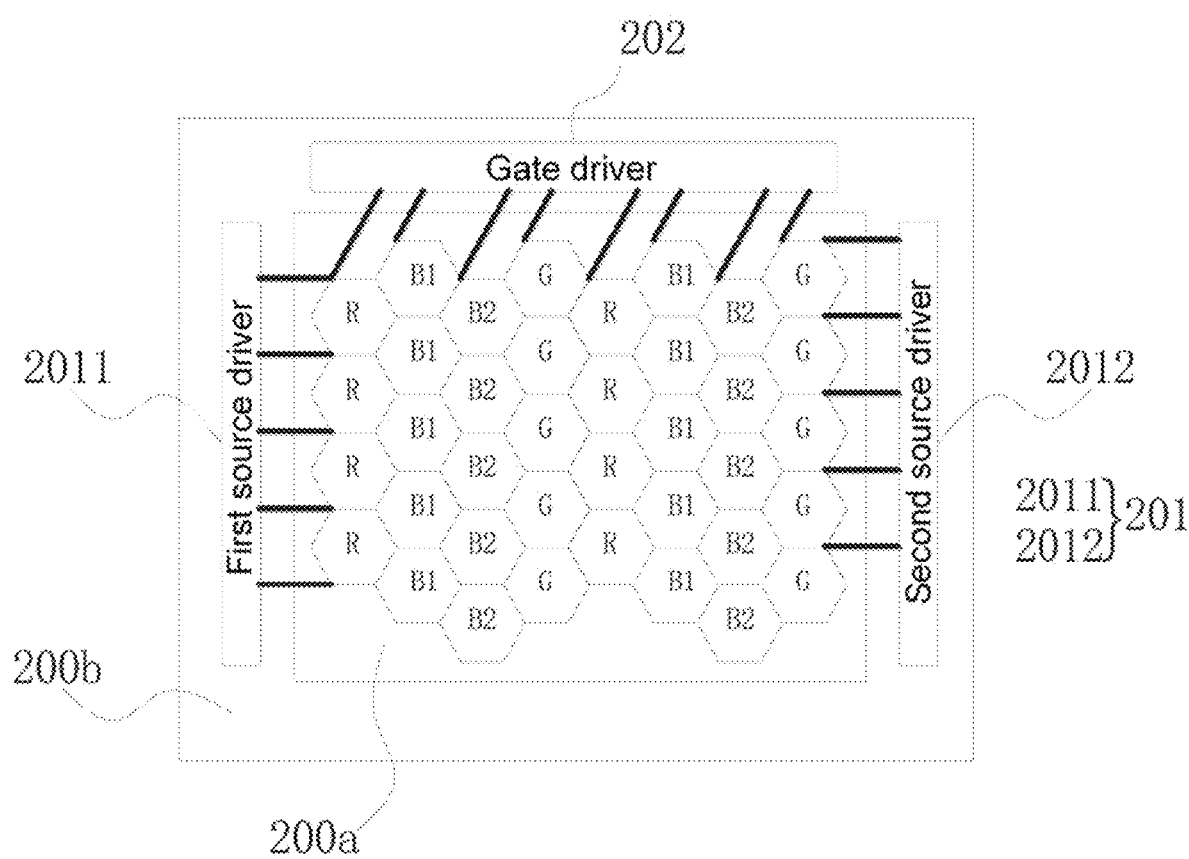
FIG. 9 is another planar structural diagram of an array substrate provided by an embodiment of the present invention.

Furthermore, as shown in FIG. 9, the array substrate includes a display region 200a and a non-display region 200b. A gate driver 202 and a source driver 201 are disposed in the non-display region. The source driver 201 includes a first source driver 2011 and a second source driver 2012 disposed on two opposite sides of the pixel structure. The first source driver 2011 is configured to provide a data signal to the odd-numbered data lines. The second source driver 2012 is configured to provide a data signal to the even-numbered data lines. The gate driver 202 is configured to provide a scanning signal to the plurality of scan lines 10. Thus, a method adopting double gate driver can increase luminous efficiency of pixels.

The present invention further provides a display panel. The display panel includes the above array substrate. The display panel can be a liquid crystal display panel.

Beneficial effects of the present invention: the display panel provided by the present invention configures each of the sub-pixels to a regular hexagonal shape, wherein corners of each of the sub-pixels are obtuse angles of 120°, which facilitate spread of printed ink droplets in the inkjet printing process and significantly increase uniformity of light emission of the sub-pixels. Also, each of the plurality of pixel units adopts an arrangement of RB1B2G or RB1GB2. Two columns of blue sub-pixels are alternately used to balance a problem of short lifetime of blue sub-pixel, which is beneficial for realizing mass production of inkjet printing products and meets a requirement of high pixel density products.

Although the present invention has been disclosed above with the preferred embodiments, it is not intended to limit the present invention. Persons having ordinary skill in this technical field can still make various alterations and modifications without departing from the scope and spirit of this invention. Therefore, the scope of the present invention should be defined and protected by the following claims and their equivalents.

What is claimed is:

1. An array substrate, comprising a pixel structure;
wherein the pixel structure comprises a plurality of scan lines and a plurality of data lines, the plurality of scan lines and the plurality of data lines define at least a portion of a plurality of pixel units by crossing one another, each of the plurality of pixel units comprises a first sub-pixel, a second sub-pixel, and a third sub-pixel connected in pairs and arranged in a honeycomb pattern, shapes of the first sub-pixel, the second sub-pixel, and the third sub-pixel are all regular hexagonal, and each column of sub-pixels displays a same color.

2. The array substrate according to claim 1, wherein the first sub-pixel, the second sub-pixel, and the third sub-pixel are respectively a red sub-pixel, a blue sub-pixel, and a green sub-pixel; and
each of the plurality of pixel units further comprises a fourth sub-pixel, the fourth sub-pixel is a blue sub-pixel, and the first sub-pixel, the second sub-pixel, the third sub-pixel, and the fourth sub-pixel are arranged in a honeycomb pattern.

3. The array substrate according to claim 2, wherein the fourth sub-pixel is disposed between the second sub-pixel and the third sub-pixel.

4. The array substrate according to claim 2, wherein the fourth sub-pixel is disposed between the third sub-pixel and the first sub-pixel of a next plurality of pixel units.

5. The array substrate according to claim 3, wherein the pixel structure comprises even-numbered rows and odd-numbered rows, and each of the plurality of pixel units comprises the first sub-pixel in an even-numbered row, the fourth sub-pixel in an even-numbered row, the second sub-pixel in an odd-numbered row, and the third sub-pixel in an odd-numbered row.

6. The array substrate according to claim 5, wherein the plurality of data lines are disposed along a longitudinal edge of each column of sub-pixels, and the plurality of data lines are polygonal line shapes; and
the plurality of scan lines comprise odd-numbered scan lines and even-numbered scan lines, and the plurality of the scan lines are disposed along a lateral edge of each column of sub-pixels.

7. The array substrate according to claim 6, wherein the array substrate comprises a gate driver and a source driver, the gate driver comprises a first gate driver and a second gate driver disposed on two opposite sides of the pixel structure, the first gate driver is configured to provide a scanning signal to the odd-numbered scan lines, the second gate driver is configured to provide a scanning signal to the even-numbered scan lines, and the source driver is configured to provide a data signal to the plurality of data lines.

8. The array substrate according to claim 5, wherein the plurality of data lines comprise odd-numbered data lines and even-numbered data lines, and the plurality of the data lines are disposed along a lateral edge of each column of sub-pixels; and
the plurality of scan lines are disposed along a longitudinal edge of each column of sub-pixels, and the plurality of scan lines are polygonal line shapes.

9. The array substrate according to claim 8, wherein the array substrate comprises a gate driver and a source driver, the source driver comprises a first source driver and a second source driver disposed on two opposite sides of the pixel structure, the first source driver is configured to provide a data signal to the odd-numbered data lines, the second source driver is configured to provide a data signal to the even-numbered data lines, and the gate driver is configured to provide a scanning signal to the plurality of scan lines.

10. An array substrate, comprising a pixel structure;
wherein the pixel structure comprises a plurality of scan lines and a plurality of data lines, the plurality of scan lines and the plurality of data lines define at least a portion of a plurality of pixel units by crossing one another, each of the plurality of pixel units comprises a first sub-pixel, and a third sub-pixel connected in pairs and arranged in a honeycomb pattern, and shapes of the first sub-pixel, the second sub-pixel, and the third sub-pixel are all regular hexagonal.

11. The array substrate according to claim 10, wherein the first sub-pixel, the second sub-pixel, and the third sub-pixel are respectively a red sub-pixel, a blue sub-pixel, and a green sub-pixel; and
each of the plurality of pixel units further comprises a fourth sub-pixel, the fourth sub-pixel is a blue sub-pixel, and the first sub-pixel, the second sub-pixel, the third sub-pixel, and the fourth sub-pixel are arranged in a honeycomb pattern.

12. The array substrate according to claim 11, wherein the fourth sub-pixel is disposed between the second sub-pixel and the third sub-pixel.

13. The array substrate according to claim 11, wherein the fourth sub-pixel is disposed between the third sub-pixel and the first sub-pixel of a next plurality of pixel units.

14. The array substrate according to claim 12, wherein the pixel structure comprises even-numbered rows and odd-numbered rows, and each of the plurality of pixel units comprises the first sub-pixel in an even-numbered row, the fourth sub-pixel in an even-numbered row, the second sub-pixel in an odd-numbered row, and the third sub-pixel in an odd-numbered row.

15. The array substrate according to claim 14, wherein the plurality of data lines are disposed along a longitudinal edge of each column of sub-pixels, and the plurality of data lines are polygonal line shapes; and
the plurality of scan lines comprise odd-numbered scan lines and even-numbered scan lines, and the plurality of the scan lines are disposed along a lateral edge of each column of sub-pixels.

16. The array substrate according to claim 15, wherein the array substrate comprises a gate driver and a source driver, the gate driver comprises a first gate driver and a second gate driver disposed on two opposite sides of the pixel structure, the first gate driver is configured to provide a scanning signal to the odd-numbered scan lines, the second gate driver is configured to provide a scanning signal to the even-numbered scan lines, and the source driver is configured to provide a data signal to the plurality of data lines.

17. The array substrate according to claim 14, wherein the plurality of data lines comprise odd-numbered data lines and even-numbered data lines, and the plurality of the data lines are disposed along a lateral edge of each column of sub-pixels; and
the plurality of scan lines are disposed along a longitudinal edge of each column of sub-pixels, and the plurality of scan lines are polygonal line shapes.

18. The array substrate according to claim 17, wherein the array substrate comprises a gate driver and a source driver, the source driver comprises a first source driver and a second source driver disposed on two opposite sides of the pixel structure, the first source driver is configured to provide a data signal to the odd-numbered data lines, the second source driver is configured to provide a data signal to the even-numbered data lines, and the gate driver is configured to provide a scanning signal to the plurality of scan lines.

19. A display panel, comprising the array substrate according to claim 10.

* * * * *